(12) United States Patent
Thibault

(10) Patent No.: US 8,466,725 B2
(45) Date of Patent: Jun. 18, 2013

(54) METHOD AND DEVICE FOR GENERATING SHORT PULSES

(76) Inventor: Pierre F. Thibault, Boucherville (CA)

(*) Notice: Subject to any disclaimer, the term of this patent is extended or adjusted under 35 U.S.C. 154(b) by 0 days.

(21) Appl. No.: 13/058,922

(22) PCT Filed: Aug. 13, 2009

(86) PCT No.: PCT/CA2009/001139
§ 371 (c)(1),
(2), (4) Date: Feb. 14, 2011

(87) PCT Pub. No.: WO2010/017643
PCT Pub. Date: Feb. 18, 2010

(65) Prior Publication Data
US 2011/0163788 A1 Jul. 7, 2011

Related U.S. Application Data

(60) Provisional application No. 61/136,111, filed on Aug. 13, 2008.

(51) Int. Cl.
*H03K 3/017* (2006.01)
*H03K 5/04* (2006.01)
*H03K 7/08* (2006.01)

(52) U.S. Cl.
USPC .............. 327/173; 327/172; 327/176

(58) Field of Classification Search
USPC .............................. 327/172, 173, 176
See application file for complete search history.

(56) References Cited

U.S. PATENT DOCUMENTS

| | | | |
|---|---|---|---|
| 6,396,338 B1 * | 5/2002 | Huang et al. | 329/336 |
| 7,249,044 B2 | 7/2007 | Kumar et al. | |
| 7,733,143 B2 * | 6/2010 | Guo et al. | 327/175 |
| 2002/0080450 A1 | 6/2002 | Hait | |
| 2003/0222330 A1 | 12/2003 | Sun et al. | |
| 2008/0069256 A1 | 3/2008 | Lakkis | |

* cited by examiner

*Primary Examiner* — John Poos
(74) *Attorney, Agent, or Firm* — Benoît & Côté

(57) ABSTRACT

There is described a method and corresponding pulse generating device, for generating an output pulse signal having an output pulse duration. The method comprises: receiving at an input port an input pulse signal comprising an input pulse duration; duplicating the input pulse signal into a first digital pulse signal and a second digital pulse signal each comprising the input pulse duration; delaying at least one of the first and the second digital pulse signals by a time delay to obtain respectively a first and a second delayed digital pulse signal, a time delay difference between the first and the second delayed digital pulse signals being substantially equal to the output pulse duration; logically combining the first and the second delayed digital pulse signals to generate the output pulse signal with the output pulse duration smaller than the input pulse duration; and outputting the output pulse signal at an output port.

18 Claims, 5 Drawing Sheets

METHOD AND DEVICE FOR GENERATING SHORT PULSES

CROSS-REFERENCE TO RELATED APPLICATIONS

This application claims priority under 35 USC§119e of U.S. provisional patent application 61/136,111 filed Aug. 13, 2008, and entitled "Method and Device for Generating Pulses", the specification of which is hereby incorporated by reference.

TECHNICAL FIELD

The present specification relates to electronics, and more particularly to methods and devices for generating short pulses.

BACKGROUND

Many applications require that relatively short pulses be generated. There are many types of existing electronic devices for generating such short pulses. However, they are typically limited to the generation of pulses each having a pulse duration of one nanosecond or more. There is however a need to generate pulses having instead a pulse duration in the order of a few picoseconds, or a few tens of picoseconds. Prior art devices are typically not suitable for addressing such a need.

Typical pulse generation methods used in prior art devices involve, for example, differentiating a relatively high slew rate electrical signal, or combining an input analog signal to its inverse delayed by a relatively small delay typically chosen to be in the order of magnitude of the desired pulse duration. While these two methods of generating pulses are relatively efficient for the generation of relatively long pulses, they are typically not usable to produce very short pulses. For example, for the duration of a pulse generated using the prior art differentiation method to be in the desired range, the signal would need to increase at a rate that is not typically achievable at relatively low costs.

U.S. Pat. No. 6,433,720 issued on Aug. 13, 2002 to Libove illustrates another manner of generating pulses which basically provides for the generation of pulses having variable, adjustable or tunable, pulse durations. This is done by triggering the pulse generation at different control voltage levels of a relatively low slew rate voltage signal. Such prior art generators are however typically very sensitive to noise since any noise present in the relatively low slew rate voltage signal or in the control voltage may change the exact start and finish timings, which affect its duration.

There is thus a need for improved devices and method for generating pulses with relatively short pulse durations.

SUMMARY

In accordance with an embodiment, there is provided a pulse generating device for generating an output pulse signal having an output pulse duration. The device comprises: a signal duplicator for receiving an input pulse signal comprising an input pulse duration, the signal duplicator for duplicating the input pulse signal into a first digital pulse signal and a second digital pulse signal each comprising the input pulse duration; a delay component operatively coupled to the signal duplicator, the delay component for delaying at least one of the first and the second digital pulse signals by a time delay to obtain respectively a first and a second delayed digital pulse signal, a time delay difference between the first and the second delayed digital pulse signals being substantially equal to the output pulse duration; and a logic circuit coupled to the delay component, the logic circuit for combining logically the first and the second delayed digital pulse signals to generate the output pulse signal with the output pulse duration smaller than the input pulse duration, the logic circuit for outputting the output pulse signal.

In accordance with an embodiment, there is provided a method for generating an output pulse signal having an output pulse duration. The method comprises: receiving at an input port of an electronic device an input pulse signal comprising an input pulse duration; duplicating the input pulse signal into a first digital pulse signal and a second digital pulse signal each comprising the input pulse duration; delaying at least one of the first and the second digital pulse signals by a time delay to obtain respectively a first and a second delayed digital pulse signal, a time delay difference between the first and the second delayed digital pulse signals being substantially equal to the output pulse duration; logically combining the first and the second delayed digital pulse signals to generate the output pulse signal with the output pulse duration smaller than the input pulse duration; and outputting the output pulse signal at an output port of the electronic device to drive an electronic or electrical circuit.

Other embodiments, advantages and features will become more apparent upon reading of the following non-restrictive detailed description, given by way of examples with reference to the accompanying drawings.

DETAILED DESCRIPTION

Figure 1:
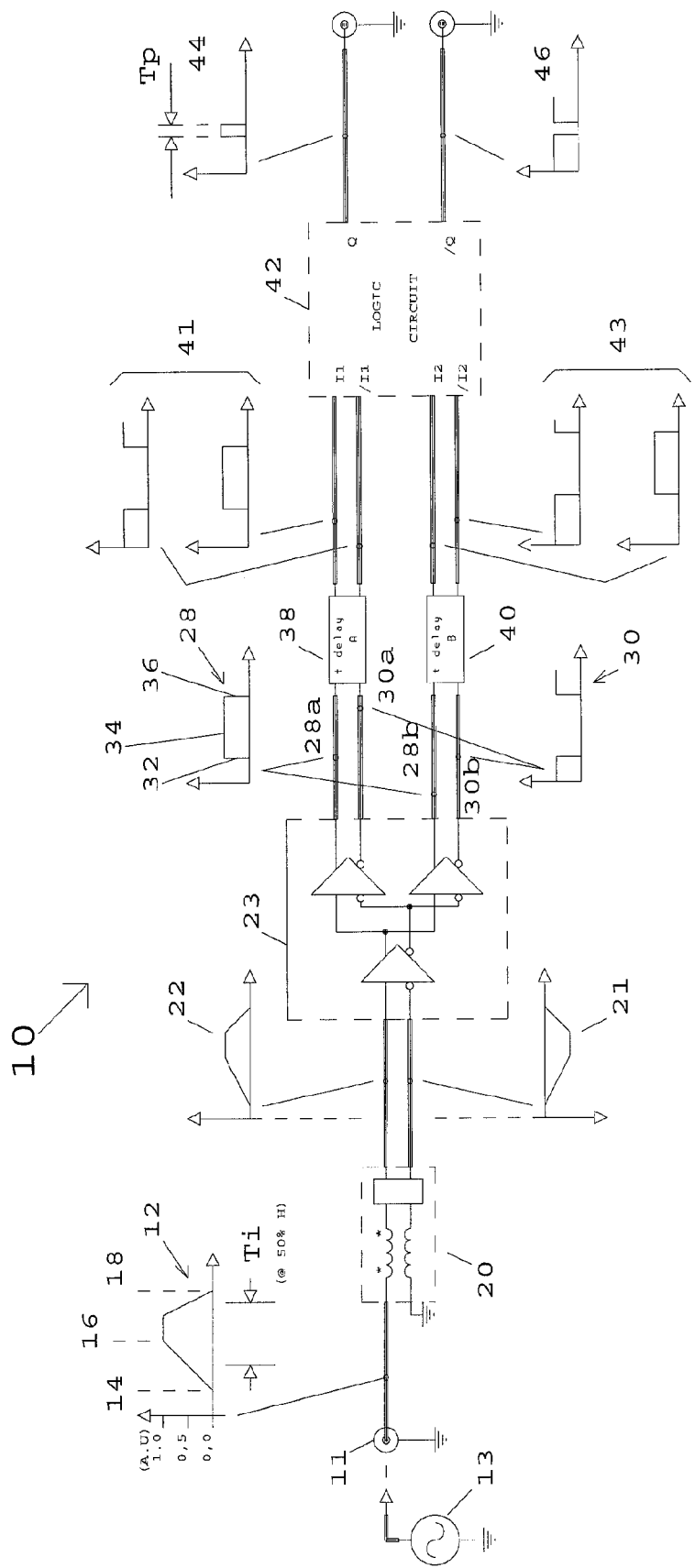
FIG. 1 is a schematic view of a pulse generating device in accordance with an embodiment.

FIG. 1 illustrates a pulse generating device 10 in accordance with an embodiment and which may be used to drive an electronic circuit (not shown) such as an amplifier, an amplifier driver, a modulator, an electro-optical circuit, a laser, a pulsed laser, a radar, a LIDAR, etc. The pulse generating device 10 generates an output pulse 44 having an output pulse duration Tp. The output pulse 44 is generated from an input pulse 12 having an input pulse duration Ti longer than the output pulse duration Tp. In an embodiment, a complementary output pulse 46 is also generated, the pulse 46 also having an output pulse duration Tp.

In some embodiments, the pulse generating device 10 includes an input port 11 for receiving an input signal 12 having a form as shown in the figure. In alternative embodiments, the pulse generating device 10 includes a signal generator 13 for generating the first input signal 12.

The first input signal 12 defines a first signal attack portion 14, a first input signal sustain portion 16 and a first input signal decay portion 18. The first input signal sustain portion extends between the first input signal attack and decay portions 14 and 18. Therefore, the first input signal 12 has the shape of a pulse. The first input signal attack, sustain and decay portions 14, 16 and 18 have relatively long durations.

The pulse generating device 10 uses the first input signal 12 to generate a pulse 44 having duration Tp that is typically made much shorter than the duration Ti of the first input signal 12. Also, while the first input signal 12 as shown on FIG. 1 has a relatively flat sustain portion 16 and respectively linearly increasing and decreasing attack and decay portions 14 and 18, these signal portions 14, 16 and 18 may take other shapes. In an embodiment, for example, the first input signal 12 is processed by the pulse generating device 10 in such a manner that only a relatively small portion of the first input signal 12 is used to generate the output pulse 44 (and/or complementary output pulse 46), allowing for various shapes to be taken by the attack, sustain and decay portions 16, 14 and 18.

As seen in the embodiment shown in FIG. 1, the signal generator 13 generates a single-ended first input signal 12. This first input signal 12 is optionally fed into a phase splitting device 20, which produces a differential signal (i.e. complementary signals 21 and 22). The phase splitting device 20 can be implemented as a variety of signal polarity inverting devices, for example, such as a balun transformer. The use of a balun transformer produces a differential signal that is usable with differential logic components, which may represent an advantage in some applications.

The phase splitting device 20 outputs the second signal 22 and the inverted second signal 21. Signal 21 is synchronized with the signal 22 and has a substantially identical shape as signal 22, though inversed. Signal 22 has substantially the shape of the input pulse signal 12, although amplitude levels, or voltage values, which characterize any one of signals 21 and 22 may not be the same as shown in FIG. 1 (nor the same as the first input signal 12).

The complementary signals 21 and 22 are fed into a signal duplicator 23. The duplicator 23 duplicates each one of the signals 22 and 21 to produce a respective duplicated pair of digital signals 28 and 30. The pair of digital signals 28 and the pair of digital signals 30 are complementary to each other (i.e. inverted versions of one another).

Alternatively, when the optional phase splitting device 20 is not used, the input signal 12 is directly fed into the duplicator 23 to produce one pair of duplicated signals 28 (or 30). The pair of duplicated signals 28 (or 30) comprises a first and a second digital pulse signals. In another embodiment, the input signal 12 is used in a single ended input configuration with a balanced output.

In FIG. 1, the signal duplicator 23 comprises a signal compressor which compresses the attack and decay portions 14 and 18 of the signals 21 and 22 (or the input signal 12 when there is no phase splitting device 20) to output signals 28 and 30 having relatively short attack and decay time durations. As also illustrated in FIG. 1, the duplicator 23 with compressor can be implemented as a fan-out slope compressor such as a commercially available differential clock/data fan-out buffer. The compressor may also be implemented as a separate component, coupled to the duplicator (not shown).

The compressor is optional since in some cases, the input signal 12 has attack and decay portions 14 and 18 which are already suitable and do not require compression.

In some embodiments, compressing the second and inverted second signals 22 and 21 is performed by using relatively large gain amplifiers that saturate at relatively low input voltages. In this case, as soon as the received signals 22 and 21 reach a relatively small level, the amplifier saturates and produces a relatively flat output. Therefore, the amplifier gain dictates by what factor the slopes of the attack and decay portions of the signals 22 and 21 are increased. A similar effect is produced in reverse on the decay portions of signals entering the amplifiers.

As detailed above, the duplicator 23 outputs a first digital pulse signal 28a and its duplicate, second digital pulse signal 28b. The duplicator also outputs a first inverted digital pulse signal 30a and its duplicate, second inverted digital pulse signal 30b.

The digital pulse signals 28a, 28b and 30a, 30b each have a respective signal attack portion 32, a signal sustain portion 34 and a signal decay portion 36. The signal sustain portion 34 extends between the signal attack and decay portions 32 and 36. As seen in the drawings, the signal attack portion 32 increases much more rapidly than the signal attack portion 14 of the input signal 12 (or of signals 21 and 22), and the signal decay portion 36 decreases much more rapidly than the signal decay portion 18 of the input signal 12 (or of signals 21 and 22).

The digital pulse signals 28a, 28b and 30a, 30b are fed into a delay component which is represented in FIG. 1 as a combination of two delay components 38 and 40. These may however be combined within one component, or alternatively only one delay may be used. Having two delay components can allow compensating for delays present in other components of the pulse generating device 10 that would result in non timing issues.

In the illustrated embodiment, the first delay component 38 receives the first digital pulse signal 28a and the first inverted digital pulse signal 30a. Similarly, the duplicate of the first digital pulse signal 28a, referred to as the second digital pulse signal 28b, and the duplicate of the first inverted digital pulse signal 30a, referred to as the second inverted digital pulse signal 30b are fed into the second delay component 40.

The first and second delay components 38 and 40 produce respectively a first delayed digital pulse signal 41 and a second delayed digital pulse signal 43, each of these signals being a differential signal including the signal itself and its inverse, as illustrated in FIG. 1. In embodiments not comprising the phase splitting device 20 or where the signal duplicator 23 provides a single ended output, the first and second delay components 38 and 40 each respectively may output non-differential delayed digital pulse signals 41 and 43 (i.e. without their respective inverse).

The first and second delay components 38 and 40 can be any suitable delay device. For example, the first and second delay components may include logic gates having response times that provide a delay in the transmission of signals. Alternatively, the first and second delay components 38 and 40 can be implemented as transmission lines printed on a printed circuit board. In yet other embodiments, the first and second delay components 38 and 40 may be implemented from commercially available delay chips providing a relatively precise delay as per their specifications and, in some cases, which also allow for the selection of the duration of a respective time delay provided by each of the components 38 and 40. Such selection may be provided by way of tunability. For example, by adjusting a time delay difference between the first and second delays of the first and second delay components 38 and 40, the pulse duration Tp of the output pulse signal 44 can be adjusted.

Figure 2:
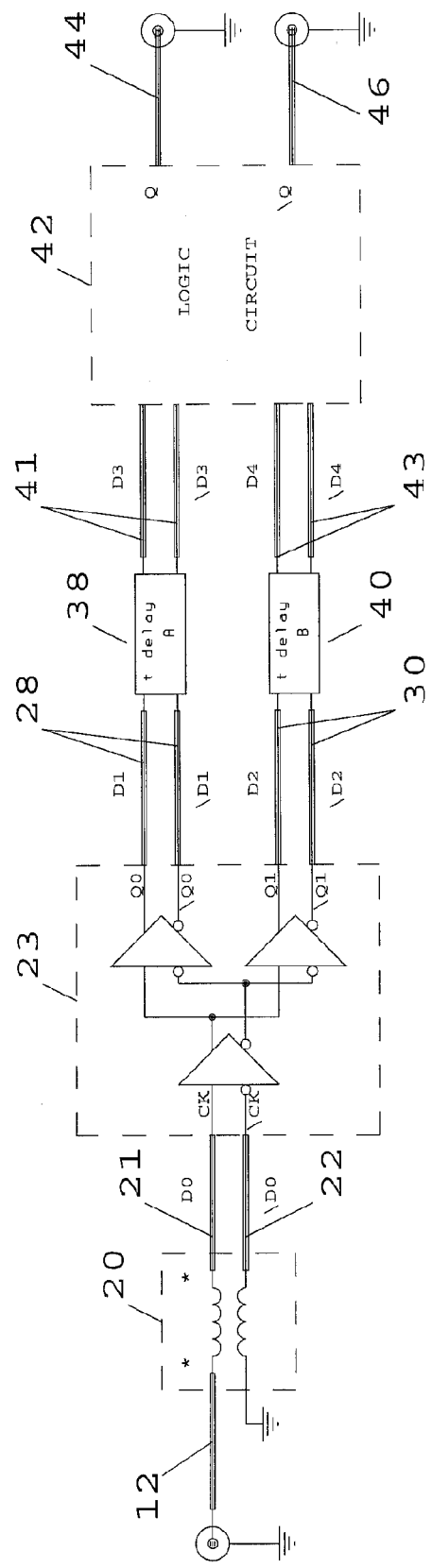
FIG. 2 is a schematic view of the pulse generating device of FIG. 1, with signal names, in accordance with an embodiment.

The first and second delayed digital pulse signals 41 and 43, and/or their inverses, are fed into a logic circuit 42 which logically combines the first and second delayed signals 41 and 43 (and/or their inverses) such that there is a non-zero output at the valid output port location of the logic circuit 42 only when both signals 41 and 43 comply with predetermined values, such as defined in the truth table provided below in Table 1. FIG. 2 provides a correspondence between the Input 1 and the Input 2 signal names as listed in Table 1 below and the numeral references provided in FIG. 1 and described herein.

Still in reference to both FIGS. 1 and 2, and the Table 1 below, the logic circuit 42 comprises gates (not shown) which are meant to implement a logic defined by such a truth table. A variety of logic combinations may thus be implemented by the circuit 42, and the logic circuit 42 may take on a variety of circuit implementations. The logic circuit 42 can be any suitable logic combiner which, for example, includes logic components that are activated/deactivated by transitions in input pulses, instead of being based on the voltage level of their inputs.

To ensure the generation of good quality impulsions, the logic circuit 42 is implemented to have a response time as fast as, or faster than, the pulse duration Tp. For example, the logic circuit 42 may include a XOR gate or an AND gate or its boolean equivalent, which provides an output pulse rate having respectively twice and once the input frequency of the first input pulse.

TABLE 1

Figure 3:
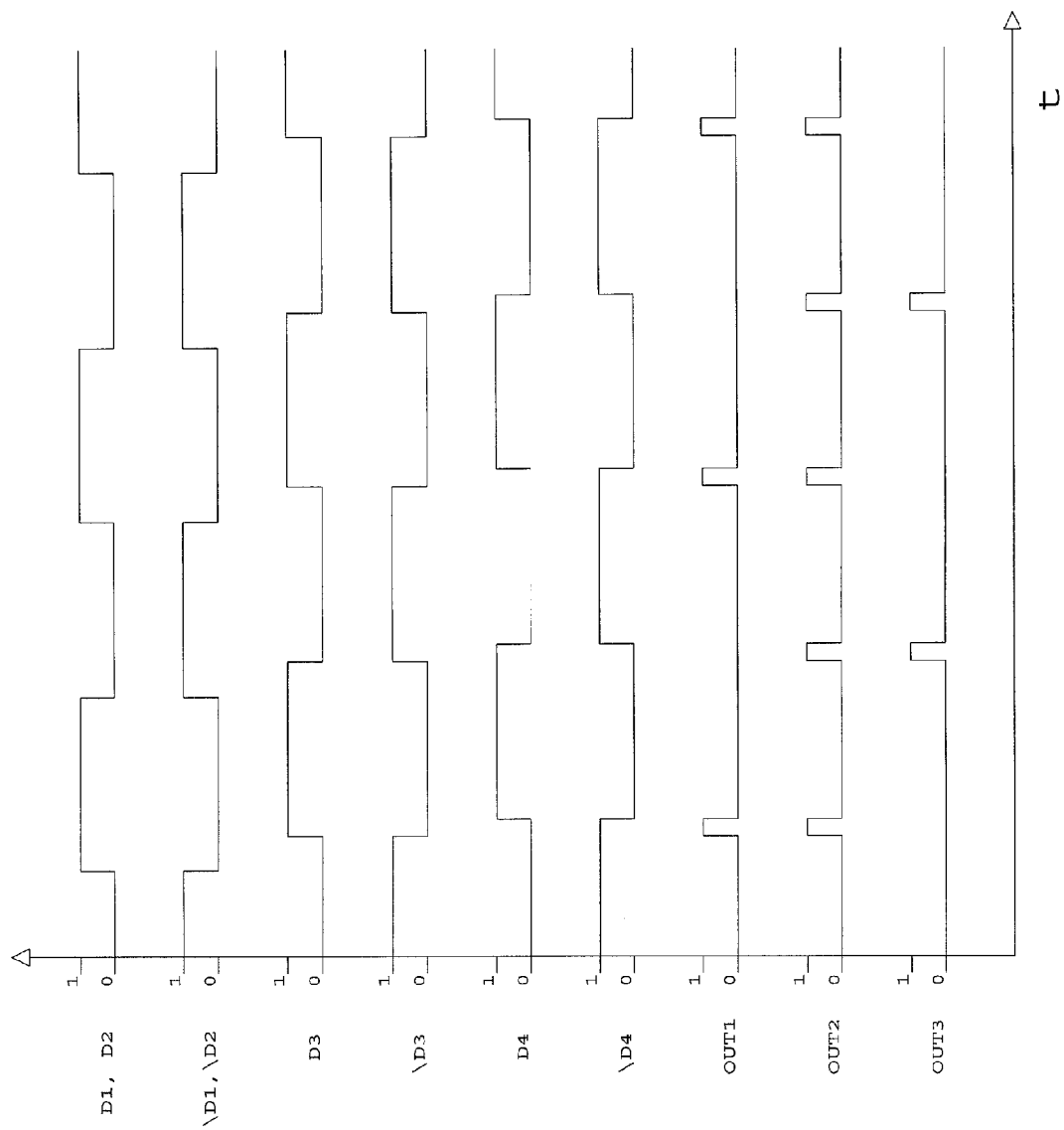
FIG. 3 is a graphical view of exemplary signal waveforms at various points within the pulse generating device of FIG. 1, in accordance with various embodiments.

| Case | Input 1 | Input 2 | Logic function | Output wave see FIG. 3 | Valid output | |
|------|---------|---------|----------------|------------------------|--------------|---|
| 1 | D3 | \D4 | AND | OUT 1 | 44 | 1 ≡ 2 |
| 2 | \D3 | D4 | NOR | OUT 1 | 46 | |
| 3 | \D3 | D4 | AND | OUT 3 | 44 | 3 ≡ 4 |
| 4 | D3 | \D4 | NOR | OUT 3 | 46 | |
| 5 | D3 | D4 | XOR | OUT 2 | 44 | |
| 6 | \D3 | \D4 | XOR | OUT 2 | 44 | |
| 7 | D3 | \D4 | XRN | OUT 2 | 46 | |
| 8 | \D3 | D4 | XRN | OUT 2 | 46 | |

In some embodiments, one of the first and second delayed digital pulse signals 41 and 43 is inverted, for example by crossing the two wires or signal transmission lines on which this signal is propagated before being input in the logic circuit 42.

FIG. 3 illustrates timing diagrams for the various signals described hereinabove and listed in Table 1. Signals 22 and 21 correspond respectively to signals D0 and \D0; signal 28a and its duplicate 28b correspond respectively to signals D1 and D2; signal 30a and its duplicate 30b correspond respectively to signals \D1 and \D2; signals 41 and 43 correspond respectively to signals D3 and D4; the inverses of signals 41 and 43 each respectively correspond to signals \D3 and \D4; signal 44 (or 46) correspond to any of the valid OUT1, OUT2 and OUT3 as provided by the above Table 1.

FIG. 3 illustrates various OUT signals waveforms such as OUT1, OUT2 and OUT3, which would be outputted in time (t) as either output pulse signal 44 or 46 depending on the logic function performed by the logic circuit 42, with reference to Table 1 above.

As seen from the FIGS. 1 to 3, differential digital logic components such as the duplicator 23 and the logic circuit 42 are used. Such differential digital logic components accept the second and inverted second signals 22 and 21, transform them into a differential logic signal formed by a first digital signal component and a second, complementary digital signal component which is simply the inverse of the first digital component. Both digital components each have either a predetermined voltage level or a zero voltage level (or a voltage level associated with either one of 0 and 1). Differential signals have the advantage of being, at least within a predetermined operational range, relatively insensible to the absolute voltage above ground level about which they vary in time. Contrary to non-digital signals, such signals represent logic values as a difference between the two voltages propagating onto two different transmission wires or transmission lines.

The above described pulse generating device 10 can be manufactured using existing components at relatively low costs or as an integrated circuit, within a single chip. It may also be implemented to allow a matching with potential applications. It has also been shown that some implementations allow robustness to temperature variations and noise.

Figure 4:
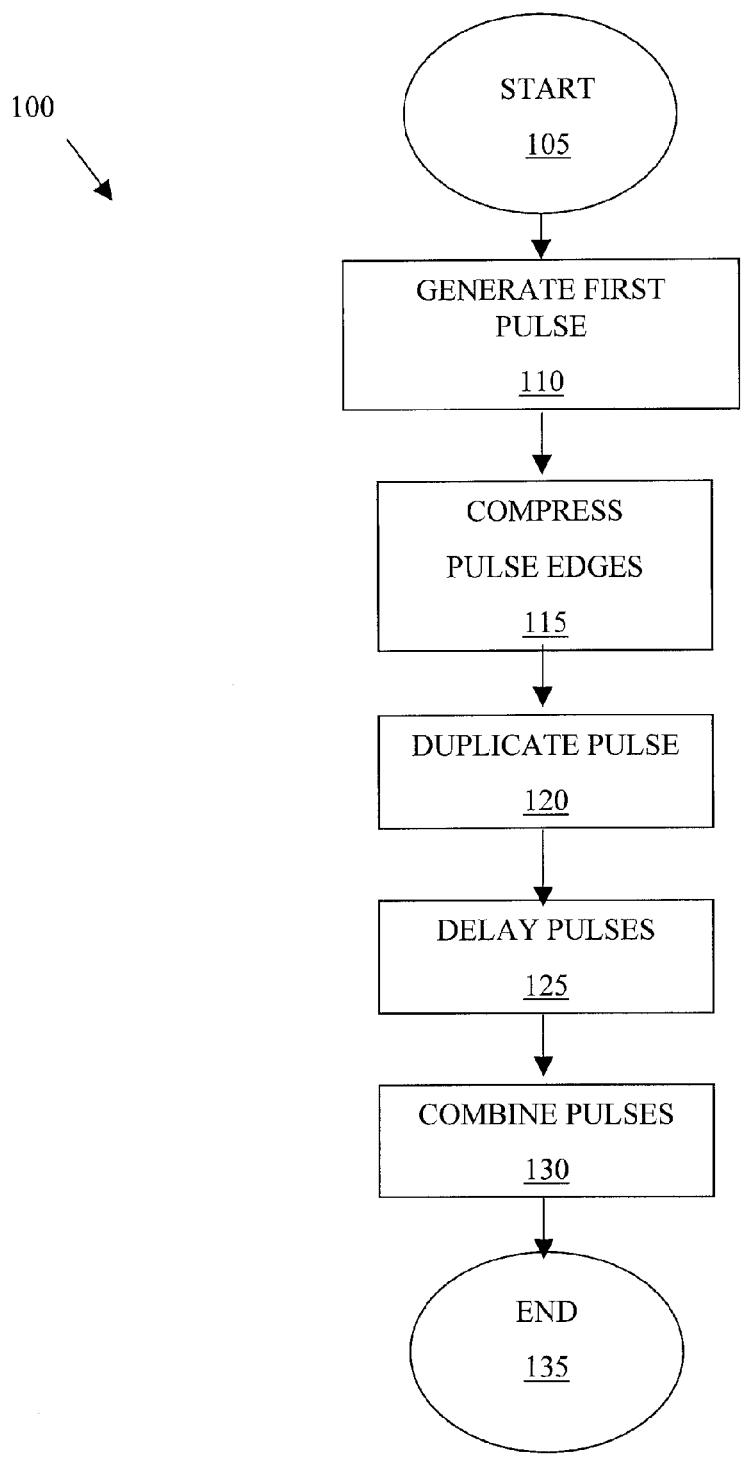
FIG. 4 is a flowchart which illustrates a method for generating a pulse in accordance with an embodiment.

Now referring to FIG. 4, there is described a method 100 for generating a short pulse signal in accordance with an embodiment. The method 100 could be implemented using the signal generating device 10 described above in reference to FIGS. 1 to 3, or using any other suitable implementation.

The method 100 starts at 105. At step 110, the method 100 optionally provides for the generation of a first input pulse signal having an input pulse duration. This can be done using a typical pulse generator. The input pulse signal defines an attack portion, a decay portion and a sustain portion extending therebetween. The input pulse signal is then fed to the input port of one of a duplicator (optionally via a compressor) for step 120 to follow.

Then, at step 115, the method optionally includes compressing in time at least one of the attack portion and the decay portion of the first pulse (also referred to as pulse edges) to produce a fast edges first pulse.

Then, at step 120, the method includes duplicating the fast edge first pulse provided at step 115, or the input pulse signal directly where step 115 is omitted, to produce a first and a second digital pulse signal. The duplicating can be performed by first converting the input pulse signal into a digital pulse signal using an analog-to-digital converter for example, and then duplicating the digital pulse signal to obtain the first digital pulse signal and the second digital pulse signal.

Afterwards, at step 125, at least one of the first and second digital pulse signals are delayed in time by a time delay to obtain respectively a first and a second delayed digital pulse signal having a time delay difference based on the output pulse duration. The time delay difference to be obtained between both delayed signals is generally chosen as being substantially equal to the output pulse duration desired. Where both first and second digital pulse signals are each delayed respectively by a first time delay and a second time delay, each time delay may be adjusted or implemented accordingly.

Finally, at step 130, the first and the second delayed digital pulse signals are logically combined to generate an output pulse signal with an output pulse duration smaller than the input pulse duration. Step 130 involves, for example, using a logic circuit which implements a truth table as that provided in TABLE 1.

As detailed herein above, the logic combination of step 130 is in the digital realm, and thus independent of a voltage level value associated with the input pulse signal.

The method ends at step 135, where the output pulse signal is outputted or, for example, released at an output port to drive an electronic or electrical circuit such as as an amplifier, an amplifier driver, a modulator, an electro-optical circuit, a laser, a pulsed laser, a radar, a LIDAR, etc.

In the above-described method 100, at least one of the first and second digital pulse signals produced at step 120 can be inverted, using for example a logical inverter, either within the logic circuit 42, or outside of the logic circuit 42. In other words, the method 100 may have an additional step of inverting, for example, one of: the input pulse signal after step 110, during step 115 or after step 115; the first and the second digital pulse signals at or after step 120; and the first and the second delayed digital pulse signals after step 125, before or at step 130.

An additional step may also be provided to produce a balanced signal so that all the pulses downstream from the additional balanced signal production step are differential signals, and all pulses present upstream of the balanced signal generation step are single-ended signals.

Figure 5:
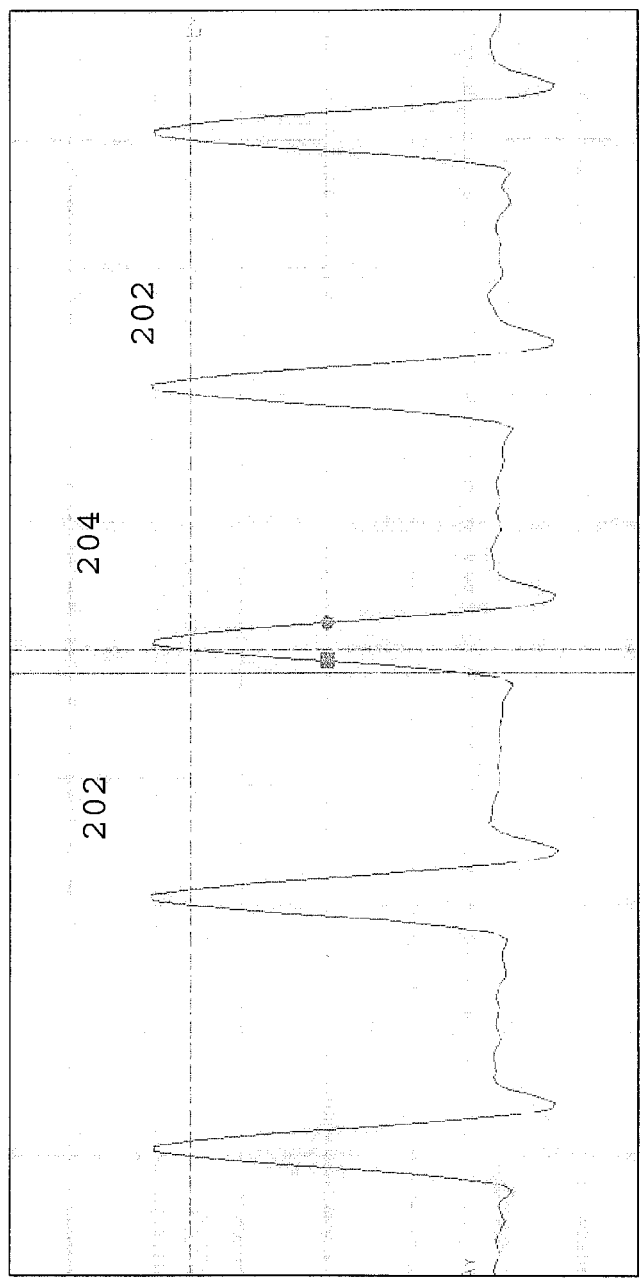
FIG. 5 is an example of an output pulse signal versus time as outputted by the pulse generating device of FIG. 1, in accordance with an embodiment.

FIG. 5 illustrates an example of an output pulse signal 200 versus time and a series of pulses 202 each having an output pulse duration 204 in accordance with an embodiment.

The above described pulse generating device and method may be implemented using differential logic components. Differential logic is generally interesting for decreasing the noise sensitivity and the Electromagnetic Interference (EMI) emission levels.

Contrary to the use of traditional NOT gates which typically increase transition time and tend to be prone to environmental conditions, the use of differential signals can also permit quicker inversion of signals since in such a case, an inversion can be achieved simply by reversing the polarity of the signal. Such an inversion can be done before or after the delay component 38 (or 40) or the delaying at step 125, among other possibilities.

In addition, the above described pulse generating device and method may be adapted for use with relatively low quality input pulse signals presenting for example high noise levels and/or relatively slow varying slopes. This is done by having a high gain, saturable amplifier, or an additional step of amplifying the input pulse signal or reducing a noise level, in or before the signal duplicator 23 (or the duplicating step 120). Such amplification minimizes the influence of noise on the shape and timing of the output pulse signal by taking advantage of input hysteresis for example.

Although the present pulse generating method and device have been described hereinabove by way of exemplary embodiments thereof. Modifications which can be made without departing from the scope of the subject matter as defined in the appended claims are considered as forming part of the present specification.

The invention claimed is:

1. A pulse generating device for generating an output pulse signal having an output pulse duration, the device comprising:
a signal duplicator for receiving an input pulse signal comprising an input pulse duration, the signal duplicator for duplicating the input pulse signal into a first digital pulse signal and a second digital pulse signal each comprising the input pulse duration;
a delay component operatively coupled to the signal duplicator, the delay component for delaying at least one of the first and the second digital pulse signals by a time delay to obtain respectively a first and a second delayed digital pulse signal, a time delay difference between the first and the second delayed digital pulse signals being substantially equal to the output pulse duration;
a logic circuit coupled to the delay component, the logic circuit for combining logically the first and the second delayed digital pulse signals to generate the output pulse signal with the output pulse duration smaller than the input pulse duration, the logic circuit for outputting the output pulse signal; and
a compressor for compressing at least one of pulse edges of the input pulse signal in time, prior to the duplicating.

2. The pulse generating device of claim 1, wherein the logic circuit is for generating the output pulse signal independently of a voltage value associated with the input pulse signal.

3. A pulse generating device for generating an output pulse signal having an output pulse duration, the device comprising:
a signal duplicator for receiving an input pulse signal comprising an input pulse duration, the signal duplicator for duplicating the input pulse signal into a first digital pulse signal and a second digital pulse signal each comprising the input pulse duration;
a delay component operatively coupled to the signal duplicator, the delay component for delaying at least one of the first and the second digital pulse signals by a time delay to obtain respectively a first and a second delayed digital pulse signal, a time delay difference between the first and the second delayed digital pulse signals being substantially equal to the output pulse duration; and
a logic circuit coupled to the delay component, the logic circuit for combining logically the first and the second delayed digital pulse signals to generate the output pulse signal with the output pulse duration smaller than the input pulse duration, the logic circuit for outputting the output pulse signal;
wherein the signal duplicator comprises an analog-to-digital converter to convert the input pulse signal into a digital pulse signal, prior to duplicating the digital pulse signal into the first digital pulse signal and the second digital pulse signal.

4. The pulse generating device of claim 1, comprising a pulse generator coupled to the signal duplicator for generating the input pulse signal comprising the input pulse duration, the pulse generator being coupled to the signal duplicator via an input port.

5. The pulse generating device of claim 1, wherein the logic circuit comprises at least one of an XOR gate, a NOR gate, an XRN gate and an AND gate.

6. The pulse generating device of claim 1, wherein the signal duplicator, the delay component and the logic circuit are integrated within a single circuit device.

7. The pulse generating device of claim 1, wherein the delay component comprises an adjustable delay component.

8. The pulse generating device of claim 1, wherein the delay component comprises at least two delay components each for respectively delaying the first and the second digital pulse signals by a first and a second time delay respectively, the time delay difference corresponding to a difference between the first and the second time delays.

9. The pulse generating device of claim 1, comprising a logical inverter coupled between one of: the signal duplicator and the delay component, and the delay component and the logic circuit, for inverting one of: the first and the second digital pulse signals; and the first and the second delayed digital pulse signals.

10. The pulse generating device of claim 1, comprising a phase splitting device coupled to the signal duplicator, the phase splitting device producing complementary input pulse signals and feeding the complementary input pulse signals to the signal duplicator.

11. The pulse generating device of claim 1, wherein the logic circuit comprises a differential logic component for inverting the first delayed digital pulse signal and the second delayed digital pulse signal.

12. A method for generating an output pulse signal having an output pulse duration, the method comprising:
receiving at an input port of an electronic device an input pulse signal comprising an input pulse duration;

duplicating the input pulse signal into a first digital pulse signal and a second digital pulse signal each comprising the input pulse duration;

delaying at least one of the first and the second digital pulse signals by a time delay to obtain respectively a first and a second delayed digital pulse signal, a time delay difference between the first and the second delayed digital pulse signals being substantially equal to the output pulse duration;

logically combining the first and the second delayed digital pulse signals to generate the output pulse signal with the output pulse duration smaller than the input pulse duration;

outputting the output pulse signal at an output port of the electronic device to drive an electronic or electrical circuit; and compressing at least one of an attack portion and a decay portion of the input pulse signal in time, prior to the duplicating, the attack portion and the decay portion defining pulse edges about a sustain portion of the input pulse signal.

13. The method of claim 12, wherein the logically combining is performed independently of a voltage value associated with the input pulse signal.

14. The method of claim 12, wherein the duplicating comprises converting the input pulse signal into a digital pulse signal, the first digital pulse signal and the second digital pulse signal being duplicated from the digital pulse signal.

15. The method of claim 12, wherein the duplicating comprises reducing a noise level in the input pulse signal.

16. The method of claim 12, comprising generating the input pulse signal comprising the input pulse duration, and sending the input pulse signal to the input port.

17. The method of claim 12, wherein at least one of the logically combining and the outputting comprises logically switching a gate to output the output pulse signal with an output pulse rate corresponding to one of: an input frequency of the input pulse signal and twice the input frequency.

18. The method of claim 12, comprising inverting one of: the input pulse signal, the first and the second digital pulse signals; and the first and the second delayed digital pulse signals.

* * * * *